(12) United States Patent
Haji et al.

(10) Patent No.: US 8,158,494 B2
(45) Date of Patent: Apr. 17, 2012

(54) METHOD FOR PROCESSING A SUBSTRATE, METHOD FOR MANUFACTURING A SEMICONDUCTOR CHIP, AND METHOD FOR MANUFACTURING A SEMICONDUCTOR CHIP HAVING A RESIN ADHESIVE LAYER

(75) Inventors: Hiroshi Haji, Yamanashi (JP); Kiyoshi Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/921,252

(22) PCT Filed: Mar. 24, 2009

(86) PCT No.: PCT/JP2009/001277
§ 371 (c)(1),
(2), (4) Date: Sep. 7, 2010

(87) PCT Pub. No.: WO2009/119064
PCT Pub. Date: Oct. 1, 2009

(65) Prior Publication Data
US 2011/0014777 A1    Jan. 20, 2011

(30) Foreign Application Priority Data

Mar. 25, 2008 (JP) ................................. 2008-077309
Feb. 16, 2009 (JP) ................................. 2009-032174

(51) Int. Cl.
*H01L 21/00* (2006.01)
(52) U.S. Cl. ......... 438/465; 438/460; 438/710; 438/765
(58) Field of Classification Search .......... 438/460–465, 438/710, 765
See application file for complete search history.

(56) References Cited

U.S. PATENT DOCUMENTS

| | | | |
|---|---|---|---|
| 7,294,933 B2* | 11/2007 | Hanaoka | 257/758 |
| 2004/0121611 A1 | 6/2004 | Arita | |
| 2005/0158665 A1* | 7/2005 | Maekawa et al. | 430/313 |
| 2006/0088983 A1 | 4/2006 | Fujisawa et al. | |
| 2007/0170582 A1* | 7/2007 | Nomura et al. | 257/723 |
| 2007/0262420 A1* | 11/2007 | Arita | 257/620 |

FOREIGN PATENT DOCUMENTS

| | | |
|---|---|---|
| JP | 2004-172364 A | 6/2004 |
| JP | 2004-193305 A | 7/2004 |
| JP | 2005-191039 A | 7/2005 |
| JP | 2006-120834 A | 5/2006 |
| JP | 2007-115778 A | 5/2007 |

OTHER PUBLICATIONS

International Search Report for PCT/JP2009/001277, Jul. 7, 2009.

* cited by examiner

*Primary Examiner* — Ha Tran T Nguyen
*Assistant Examiner* — Shaun Campbell
(74) *Attorney, Agent, or Firm* — RatnerPrestia

(57) ABSTRACT

A mask used when a semiconductor wafer is diced into individual semiconductor chips by plasma etching is formed as follows. First, a pattern of a liquid-repellent film is formed by printing a liquid-repellent liquid on the area to be etched on the rear surface of the semiconductor wafer. Next, a resin film thicker than the liquid-repellent film is formed in the area not having the liquid-repellent film by supplying a liquid resin to the rear surface on which the liquid-repellent pattern has been formed. Then, the resin film is cured to form the mask covering the area other than the area to be removed by the etching. This method allows the formation of an etching mask without using a high-cost method such as photolithography.

3 Claims, 7 Drawing Sheets

US 8,158,494 B2

METHOD FOR PROCESSING A SUBSTRATE, METHOD FOR MANUFACTURING A SEMICONDUCTOR CHIP, AND METHOD FOR MANUFACTURING A SEMICONDUCTOR CHIP HAVING A RESIN ADHESIVE LAYER

THIS APPLICATION IS A U.S. NATIONAL PHASE APPLICATION OF PCT INTERNATIONAL APPLICATION No. PCT/JP2009/001277.

TECHNICAL FIELD

The present invention relates to a method for processing a substrate such as a semiconductor wafer so as to partially remove it, a method for manufacturing a semiconductor chip by applying the method for processing a substrate, and a method for manufacturing a semiconductor chip having a resin adhesive layer.

BACKGROUND ART

Semiconductor devices mounted on an electronic device substrate or the like are manufactured by cutting a semiconductor wafer into semiconductor chips each including individual semiconductor apparatuses as integrated circuits implemented in a wafer state. In recent years, semiconductor chips are decreasing in thickness, and therefore, becoming harder to handle. In line with this, it has been proposed to cut a semiconductor wafer into semiconductor chips by plasma etching, which is called plasma dicing.

Plasma dicing means to cut a semiconductor wafer along lattice-shaped scribe lines indicating cutting positions by plasma etching, while the wafer is masked with a resist film mask except for the scribe lines. Therefore, plasma dicing requires a process for forming a mask over the semiconductor wafer. Conventionally, such a mask is formed as follows: a scribe line pattern is transferred using a photosensitive material based on photolithography (Patent Literature 1), or a mask layer is formed on the surface of the semiconductor wafer and then the area of the mask layer that is on the scribe line region is removed by laser radiation (Patent Literature 2).

However, these conventional mask forming processes are costly. More specifically, the mask formation based on photolithography is high cost because photolithography is intended to be used for the formation of high precision patterns of integrated circuits or the like, thereby requiring complicated steps and expensive equipment. The mask formation by laser radiation is also high cost because it requires equipment for laser radiation. The cost for mask formation is a concern not only in plasma dicing, but also in various other processes for processing a substrate using plasma etching. Examples of such processes are as follows: a process for forming through-holes in a substrate, a process for processing a substrate for MEMS (micro electro mechanical systems) devices, and a process for forming integrated circuits on a display transparent panel.

Patent Literature 1: Japanese Patent Unexamined Publication No. 2004-172364
Patent Literature 2: Japanese Patent Unexamined Publication No. 2005-191039

SUMMARY OF THE INVENTION

An object of the present invention is to provide a method for processing a substrate which allows low-cost formation of a mask for plasma etching, a method for manufacturing a semiconductor chip by applying the method for processing a substrate, and a method for manufacturing a semiconductor chip having a resin adhesive layer.

The method for processing a substrate according to the present invention partially removes a substrate by plasma etching. This method includes the following processes: forming a liquid-repellent pattern by printing a liquid-repellent liquid on an area of the surface to be processed of the substrate, the area being to be removed by the etching; forming a resin film thicker than the liquid-repellent pattern by supplying a liquid resin to the surface to be processed on which the liquid-repellent pattern has been formed, the resin film being formed in an area not having the liquid-repellent pattern; forming a mask by curing the resin film, the mask being formed on the surface to be processed and covering the area other than the area to be removed by the etching; removing the liquid-repellent pattern from the surface to be processed after the mask is formed; plasma etching the substrate from the side of the surface to be processed after the liquid-repellent pattern is removed; and removing the mask from the surface to be processed after the etching.

The above-described method proceeds as follows. First, a liquid-repellent pattern is formed by printing a liquid-repellent liquid on the area of the surface to be etch-processed of the substrate. Next, a resin film thicker than the liquid-repellent pattern is formed in the area not having the liquid-repellent pattern by supplying a liquid resin to the surface to be processed on which the liquid-repellent pattern has been formed. Then, the resin film is cured to form the mask covering the area other than the area to be removed by the etching. This allows the formation of a mask for plasma etching at low cost instead of using a high-cost method such as photolithography.

The method for manufacturing a semiconductor chip according to the present invention cuts a semiconductor wafer into semiconductor chips by plasma etching. The semiconductor wafer has semiconductor apparatuses on its circuit-forming face covered with a protective sheet, and the semiconductor chips each include individual semiconductor apparatuses. This method includes the following processes: forming a liquid-repellent pattern by printing a liquid-repellent liquid on scribe lines on the surface to be processed opposite to the circuit-forming face of the semiconductor wafer, the scribe lines being the boundaries between the semiconductor chips; forming a resin film thicker than the liquid-repellent pattern by supplying a liquid resin to the surface to be processed on which the liquid-repellent pattern has been formed, the resin film being formed in an area not having the liquid-repellent pattern; forming a mask by curing the resin film, the mask being formed on the surface to be processed and covering the area other than the area to be removed by the etching; removing the liquid-repellent pattern from the surface to be processed after the mask is formed; plasma etching the semiconductor wafer from the side of the surface to be processed until the protective sheet is exposed on the side of the surface to be processed after the liquid-repellent pattern is removed; and removing the mask from the surface to be processed after the etching.

The above-described method for manufacturing a semiconductor chip by cutting a semiconductor wafer into semiconductor chips each including individual semiconductor apparatuses by plasma etching proceeds as follows. First, a liquid-repellent pattern is formed by printing a liquid-repellent liquid on the area of the surface to be etch-processed of the semiconductor wafer. Next, a resin film thicker than the liquid-repellent pattern is formed in the area not having the liquid-repellent pattern by supplying a liquid resin to the surface to be processed on which the liquid-repellent pattern has been formed. Then, the resin film is cured to form the mask covering the area other than the area to be removed by the etching. This allows the formation of a mask for plasma etching at low cost, thereby manufacturing semiconductor chips at low cost.

The method for manufacturing a semiconductor chip having a resin adhesive layer according to the present invention dices a semiconductor wafer into individual semiconductor apparatuses by plasma etching. The semiconductor wafer has semiconductor apparatuses on its circuit-forming face covered with a protective sheet, and the semiconductor chips each have the resin adhesive layer on their rear surface for die bonding. This method includes the following processes: forming a liquid-repellent pattern by printing a liquid-repellent liquid on scribe lines on the rear surface opposite to the circuit-forming face of the semiconductor wafer, the scribe lines being the boundaries between the semiconductor chips; forming a resin film thicker than the liquid-repellent pattern by supplying a liquid resin to the rear surface on which the liquid-repellent pattern has been formed, the resin film being formed in the area not having the liquid-repellent pattern; forming the resin adhesive layer by semi-curing the resin film; removing the liquid-repellent pattern from the rear surface after the resin adhesive layer is formed; and plasma etching the semiconductor wafer from the side of the rear surface until the protective sheet is exposed on the side of the rear surface, using the resin adhesive layer as a mask after the liquid-repellent pattern is removed.

The above-described method for manufacturing a semiconductor chip by cutting a semiconductor wafer into semiconductor chips each having a resin adhesive layer and including semiconductor apparatuses by plasma etching proceeds as follows. First, a liquid-repellent pattern is formed by printing a liquid-repellent liquid on the scribe lines on the rear surface opposite to the circuit-forming face of the semiconductor wafer, the scribe lines being the boundaries between the semiconductor chips. Next, a resin film thicker than the liquid-repellent pattern is formed in the area not having the liquid-repellent pattern by supplying a liquid resin to the rear surface on which the liquid-repellent pattern has been formed. The resin film is semi-cured to form the resin adhesive layer, and the liquid-repellent pattern is removed from the rear surface. Then, the semiconductor wafer is etched from the side of the rear surface, using the resin adhesive layer as a mask. As a result, the mask for plasma etching can be formed at low cost, and can also be used as a resin adhesive layer for die bonding.

Figure 1A:
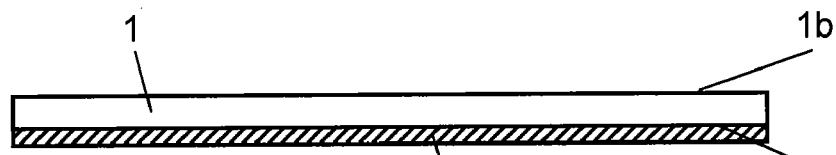
FIG. 1A shows a step of a method for processing a substrate according to a first exemplary embodiment of the present invention.

REFERENCE MARKS IN THE DRAWINGS 1 semiconductor wafer
1a circuit-forming face
1b rear surface (surface to be processed)
1c scribe line
1e, 1f semiconductor chip
2 protective sheet
3 liquid-repellent film
4 resin film
4m mask
40 resin film
40m resin adhesive layer
P plasma

DETAILED DESCRIPTION OF PREFERRED EMBODIMENTS

First Exemplary Embodiment

Figure 2:
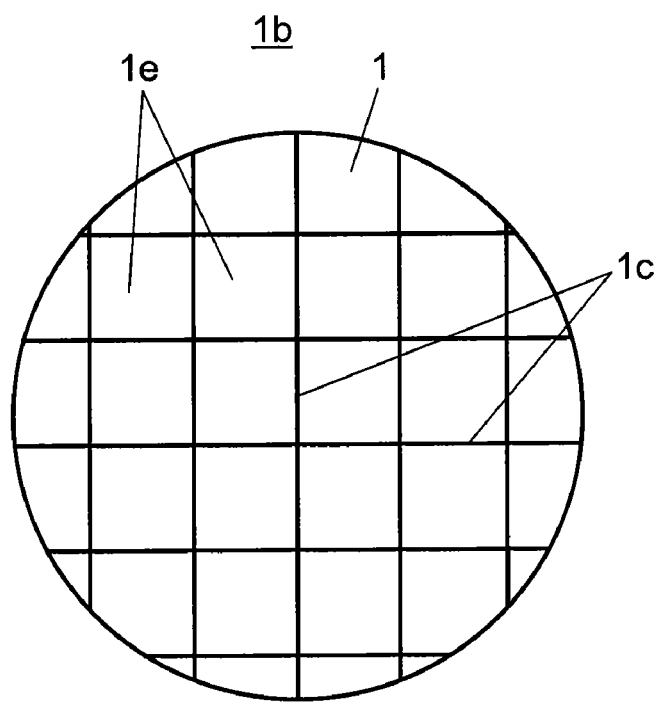
FIG. 2 is a plan view of a semiconductor wafer to be processed in the method for processing a substrate according to the first exemplary embodiment.
Figure 3:
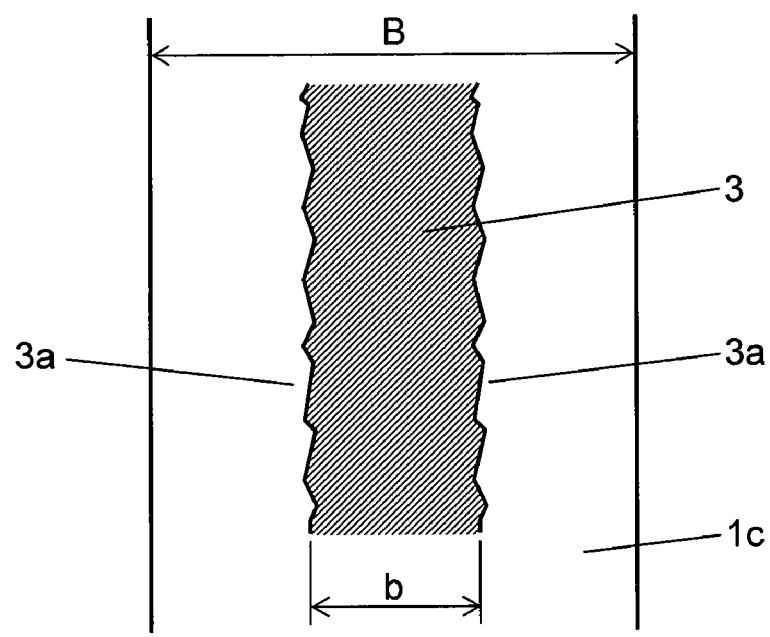
FIG. 3 is an enlarged view of a liquid-repellent pattern used in the method for processing a substrate according to the first exemplary embodiment.
Figure 4:
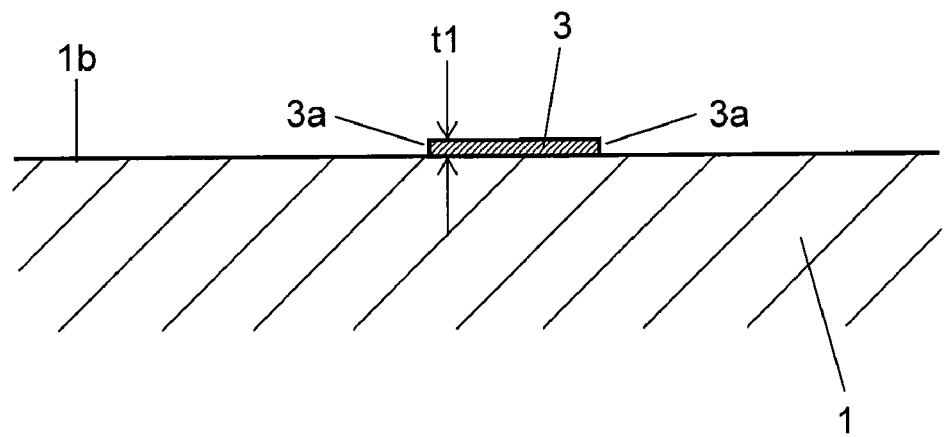
FIG. 4 is an enlarged sectional view of the semiconductor wafer to be processed in the method for processing a substrate according to the first exemplary embodiment.
Figure 5:
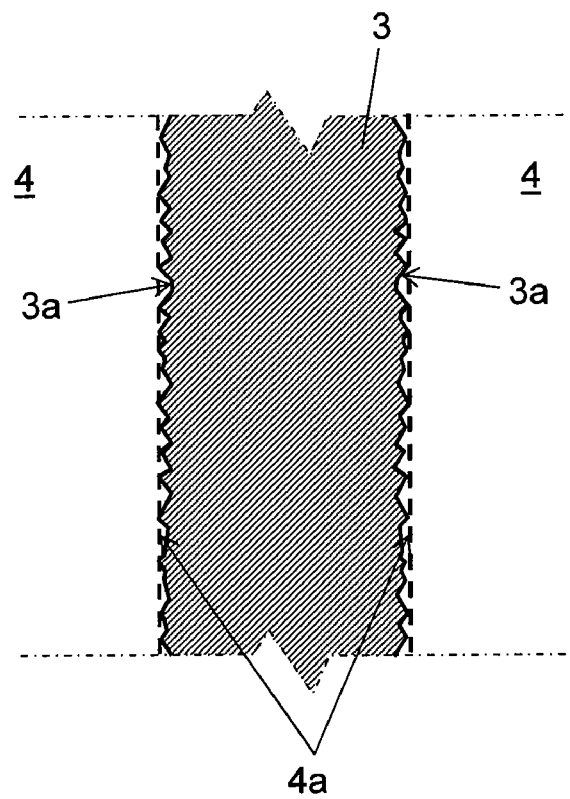
FIG. 5 is an enlarged view of a liquid resin and the liquid-repellent pattern used in the method for processing a substrate according to the first exemplary embodiment.
Figure 6:
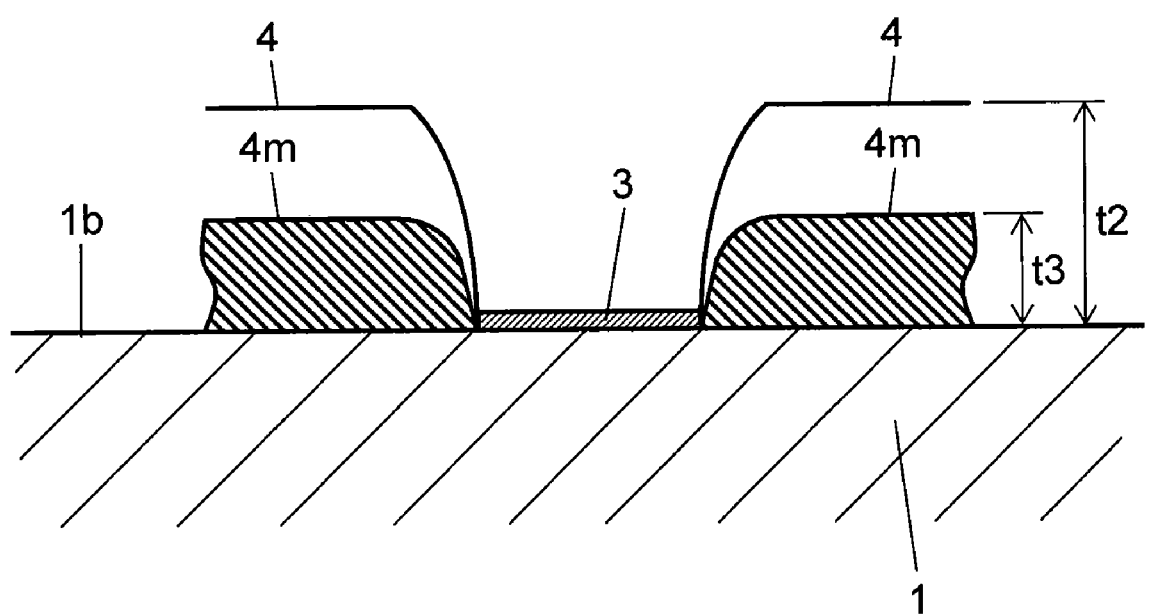
FIG. 6 is a sectional view of a resin layer and a mask used in the method for processing a substrate according to the first exemplary embodiment.

FIGS. 1A to 1F show steps of a method for processing a substrate according to a first exemplary embodiment of the present invention. FIG. 2 is a plan view of a semiconductor wafer to be processed in the method. FIG. 3 is an enlarged view of a liquid-repellent pattern used in the method. FIG. 4 is an enlarged sectional view of the semiconductor wafer to be processed in the method. FIG. 5 is an enlarged view of a liquid resin and the liquid-repellent pattern used in the method. FIG. 6 is a sectional view of a resin layer and a mask used in the method.

First, the liquid-repellent pattern and the mask used in the present exemplary embodiment will be described as follows. The liquid-repellent pattern is a resin (a repellent agent) which repels a solvent in a liquid resin that will become the mask as described later. This pattern can be formed by printing a liquid containing a repellent agent dissolved in a solvent (a liquid-repellent liquid) in a predetermined pattern and then volatizing the solvent. The printing can be transfer printing, screen printing, dispensing, inkjet printing, or the like.

The mask is made of resin (resist) which cannot be removed by fluorine-based plasma, but can be removed (ashed) by oxygen or oxygen-containing plasma. One such resin is a hydrocarbon-based resin. The mask is formed by applying a liquid resin containing the resist dissolved in a solvent to the surface to be processed of the substrate on which the above-described liquid-repellent pattern has been formed. The liquid resin is applied by dispensing, inkjet printing, spin coating, or the like. The liquid resin applied to the surface to be processed is spread to the area on the surface other than the area having the liquid-repellent pattern because the solvent is repelled by the repellent agent. Then, the solvent in the liquid resin is volatized in a baking process so as to adhere the resist to the surface to be processed, thereby completing the mask of a liquid pattern.

In the present invention, it is essential that the repellent agent has repellency against the solvent in the liquid resin that will become the mask. In addition, the solvent has to be able to be blended with the resin used as the resist. In general, two different chemical materials are easily blended when their SP values (solubility parameters) are close to each other, and are repelled when the values are different from each other. Therefore, in a case where the resist is a hydrocarbon-based resin (SP value: 7.0 to 8.0), the solvent used is a saturated hydrocarbon-based solvent having an SP value of 7.0 to 8.0. The solvents used in the repellent agent and in the liquid resin are required to have different SP values from each other, and these SP values are preferably different by 1.0 or more. Therefore, in a case where the solvent is a saturated hydrocarbon-based solvent (SP value: 7.0 to 8.0), the repellent agent can be an acrylic-based resin (SP value: 9.2), a fluorine-based resin (SP value: 3.6), or the like. In a case of using a saturated hydrocarbon-based solvent having an SP value of 8.0, the repellent agent can be a silicon-based resin (SP value: 7.0).

Thus, when the repellent agent is made of a material whose SP value is different by 1.0 or more from the solvent in the liquid resin, the liquid resin that will become the mask can be easily applied to the area on the surface to be processed other than the area having the liquid-repellent pattern.

The following is a description, with reference to FIGS. 1A to 1F, of the method for processing a substrate. In this method, the material of the substrate is partially removed by plasma etching. In the following description, the substrate to be processed is a semiconductor wafer which has been partitioned into a plurality of semiconductor apparatuses by scribe lines. The semiconductor wafer is going to be cut into semiconductor chips by partially removing the scribe lines by plasma etching, which is also referred to as plasma dicing. Thus, the present first exemplary embodiment describes a method for manufacturing a semiconductor chip including semiconductor apparatuses by cutting a semiconductor wafer into semiconductor chips by plasma etching. The semiconductor wafer has semiconductor apparatuses on its circuit-forming face covered with a protective sheet.

As shown in FIG. 1A, semiconductor wafer 1 as a substrate includes a plurality of semiconductor chips each including integrated circuits (semiconductor apparatuses). Semiconductor wafer 1 has circuit-forming face 1a and rear surface 1b opposite to circuit-forming face 1a. Circuit forming face 1a has integrated circuits mounted thereon, and is covered with protective sheet 2 for protecting the integrated circuits. Rear surface 1b is thinned to not more than 100 μm by removing its surface by mechanical grinding in a previous thinning process.

Figure 1B:
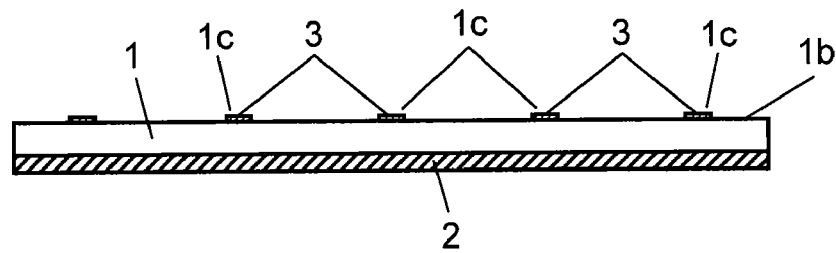
FIG. 1B shows another step of the method for processing a substrate according to the first exemplary embodiment.

As shown in FIG. 1B, a liquid-repellent pattern is formed on rear surface 1b of semiconductor wafer 1 (corresponding to the surface to be etch-processed of the substrate). The pattern is formed along grid lines corresponding to scribe lines 1c (see FIG. 2) which divide semiconductor wafer 1 into individual semiconductor chips 1e (liquid-repellent pattern formation process). The liquid-repellent pattern formation process includes a printing process and a baking process. The printing process prints the liquid-repellent liquid on the surface to be processed in a predetermined pattern. The baking process adheres the repellent agent to the surface to be processed by volatizing the solvent in the printed liquid-repellent liquid so as to form liquid-repellent film 3. The printing process is performed by applying a liquid-repellent liquid linearly by transfer printing, screen printing, dispensing, inkjet printing, or the like. More specifically, as shown in FIG. 3, the liquid which will become liquid-repellent film 3 is printed along the lattice-shaped scribe lines 1c. Liquid-repellent film 3 has a print width b (about 20 μm) within a section width B (about 50 to 60 μm) of scribe lines 1c including a margin for dicing. Liquid-repellent film 3 can be within the section width B of scribe lines 1c in the width direction, and therefore, has an allowable error of about ±20 μm. In addition, liquid-repellent film 3 has edges 3a at its both ends in the width direction, which are not required to be strictly straight and can be slightly zigzagged. After the printing process, semiconductor wafer 1 is subjected to the baking process and heated to 40° C. to 50° C. As a result, the repellent agent is adhered to rear surface 1b and becomes liquid-repellent film 3. As shown in FIG. 4, liquid-repellent film 3 has a thickness t1 of 0.1 μm to 2 μm. The baking process could be performed in a vacuum to reduce the baking temperature, thereby preventing an increase in the print width b. In a case where the solvent volatizes during the printing process, the baking process becomes unnecessary.

Figure 1C:
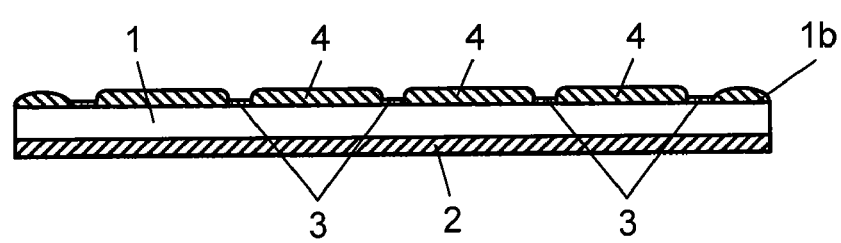
FIG. 1C shows another step of the method for processing a substrate according to the first exemplary embodiment.
Figure 1D:
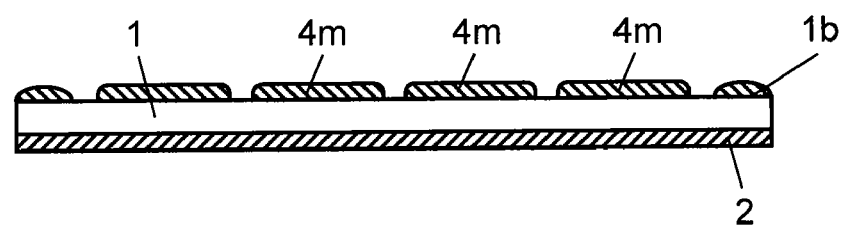
FIG. 1D shows another step of the method for processing a substrate according to the first exemplary embodiment.

As shown in FIGS. 1C and 1D, the liquid resin that will become the mask is applied to rear surface 1b as the surface to be processed of semiconductor wafer 1 on which the pattern of liquid-repellent film 3 has been formed. The liquid resin is repelled by the surface of liquid-repellent film 3 and is left in the area not having liquid-repellent film 3. This results in the formation of resin film 4 in the area not having the liquid-repellent pattern on rear surface 1b of semiconductor wafer 1 (resin film formation process). The resin (resist) in the liquid resin is a hydrocarbon-based resin which cannot be removed by plasma etching intended to remove the silicon composing semiconductor wafer 1, but which can be removed by plasma ashing intended to remove the mask described later. Resin film 4 is formed using a solution containing the hydrocarbon-based resin dissolved in a saturated hydrocarbon-based solvent. The hydrocarbon-based resin in the solution is adjusted to have a concentration which affects not only the viscosity of the liquid resin but also the planar expansion of resin film 4 with respect to the liquid-repellent pattern (the shape of the mask). Resin film 4 can be formed by dipping, spin coating, dispensing, inkjet printing, or other various methods.

FIG. 5 is an enlarged view of the state of the contact between liquid-repellent film 3 and resin film 4 after the resin film formation process. Liquid-repellent film 3 has slightly zigzagged (serrated) edges 3a at its both ends in the width direction, but resin film 4 has nearly straight and smooth contour 4a (shown by dotted lines in FIG. 5) which is in contact with edges 3a. The reason for such contour 4a is that resin film 4 is liquid having surface tension, which prevents resin film 4 from following the fine asperities of edges 3a. This is an advantageous property to form a mask having smooth edges. Resin film 4 having smooth contour 4a is then subjected to the subsequent baking process so as to form a mask whose edges are well fitted to contour 4a (smooth edges). Then, semiconductor wafer 1 having resin film 4 is subjected to the baking process again and heated to 40° C. to 70° C. This results in the formation of mask 4m on rear surface 1b as the surface to be processed. Mask 4m covers the area other than the area to be removed by plasma etching (the range of liquid-repellent film 3 along scribe lines 1c) after the solvent in resin film 4 is volatized (mask formation process).

FIG. 6 is a sectional view of the resin film and the mask. In the mask formation process, the solvent is evaporated from resin film 4, making thickness t3 of the mask smaller than thickness t2 of the resin film. Therefore, thickness t3 of the mask is controlled by controlling film thickness t2 of resin film 4, that is, the amount of coating of the liquid resin. Thickness t3 of the mask is determined in consideration of etching resistance of the mask and the ashing time. In the present embodiment, thickness t3 is preferably in the range of 5 μm to 20 μm. The relation (the rate of shrinkage) between thicknesses t2 and t3 can be determined by experiments or the like. Therefore, film thickness t2 of resin film 4 required to determine thickness t3 of the mask is determined from the rate of shrinkage and thickness t3. Once film thickness t2 is determined, the required amount of the liquid resin is determined by geometrical calculation.

After the mask formation process, the pattern of liquid-repellent film 3 is dissolved by the solvent so as to be removed from rear surface 1b as the surface to be processed (liquid-repellent pattern removal process). This process is performed by applying the solvent to rear surface 1b after the mask is formed, thereby dissolving the resin in liquid-repellent film 3 and removing it together with the solvent. The solvent can be a ketone, a polyhydric alcohol, a cyclic ether, a lactone, an ester, or the like, and should have an SP value not very different from that of the material used for liquid-repellent film 3. When the solvent is applied to rear surface 1b, liquid-repellent film 3 can be removed by dipping, spin etching, spraying, or the like.

The liquid-repellent pattern removal process may be performed by plasma ashing using oxygen plasma. In other words, after the mask formation process, oxygen plasma is applied to semiconductor wafer 1 from the side of rear surface 1b. As a result, liquid-repellent film 3 and mask 4m, which are organic substances, are ashed by oxygen plasma and removed. However, even after liquid-repellent film 3 is ashed and removed, mask 4m maintains a sufficient thickness on rear surface 1b because thickness t3 of mask 4m is much larger than thickness t1 of liquid-repellent film 3. Thus, mask 4m fulfils its function as a mask for plasma etching.

Figure 1E:
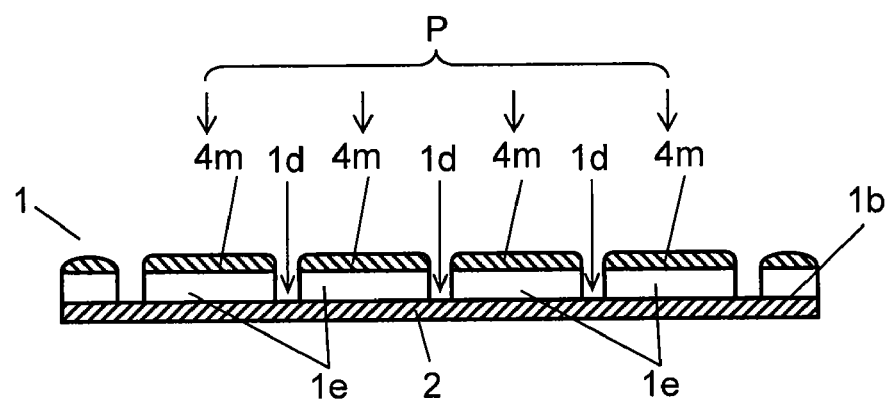
FIG. 1E shows another step of the method for processing a substrate according to the first exemplary embodiment.

After the liquid-repellent pattern removal process, semiconductor wafer 1 is subjected to plasma etching for dicing from the side of rear surface 1b, which is the surface to be processed. The etching is performed until protective sheet 2 is exposed on the side of rear surface 1b (etching process). More specifically, semiconductor wafer 1 is carried to a plasma treatment device, and subjected to fluorine-based plasma P (FIG. 1E) such as SF6 from the side of rear surface 1b. As a result, the area on rear surface 1b that is not covered with mask 4m and is exposed to plasma P is removed by the etching effect of plasma P, thereby forming etched grooves 1d. Etched grooves 1d penetrate throughout semiconductor wafer 1 so as to cut semiconductor wafer 1 into individual semiconductor chips 1e as shown in FIG. 1E.

The etching using plasma P produces mask 4m having smooth edges, allowing individual semiconductor chips 1e to have diced edges with an even and smooth cut section. This reduces problems that are likely to occur when the cut sections are rough, such as fine cracks due to the stress concentration in a slightly uneven cut section, thereby preventing a reduction in the reliability of the semiconductor chips.

Figure 1F:
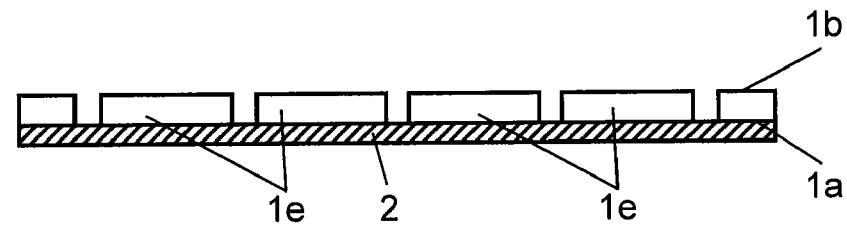
FIG. 1F shows another step of the method for processing a substrate according to the first exemplary embodiment.

Then, as shown in FIG. 1F, after the etching process, semiconductor wafer 1 is subjected to a process for removing mask 4m from rear surface 1b, which is the surface to be processed (mask removal process). The mask removal is performed by ashing and removing resin film 4 made of the hydrocarbon-based resin by oxygen plasma. Alternatively, mask 4m may be mechanically peeled off from rear surface 1b, or removed by moistening it with a chemical solution. Semiconductor wafer 1 which has gone through the mask removal, that is, semiconductor chips 1e which are covered with protective sheet 2 on the side of circuit-forming face 1a, are transferred by bonding rear surface 1b to the dicing sheet. Then, protective sheet 2 is peeled off from semiconductor chips 1e, thereby completing an array of semiconductor chips 1e held by the dicing sheet from the side of rear surface 1b. This array of semiconductor chips 1e is carried to a die bonding device in which individual semiconductor chips 1e are held by the bonding head, and taken out of the dicing sheet.

As described above, according to the plasma dicing in the present exemplary embodiment, the mask for plasma etching is formed in the following manner. First, a liquid-repellent pattern of liquid-repellent film 3 is formed by printing a liquid-repellent liquid on the area to be etched of semiconductor wafer 1. Then, resin film 4 thicker than liquid-repellent film 3 is formed in the area not having the liquid-repellent pattern by supplying a liquid resin to the surface to be processed on which the liquid-repellent pattern has been formed. Then, the semiconductor wafer on which resin film 4 has been formed is subjected to a baking process, thereby forming mask 4m covering the area other than the area to be removed by the etching. The liquid-repellent pattern used in the above-mentioned method is not required to have high positioning and shaping accuracy, and therefore, can be prepared at low cost, using existing technology requiring simple and inexpensive equipment. As a result, the mask for plasma etching can be formed at low cost instead of using a high-cost method such as photolithography or laser radiation.

Second Exemplary Embodiment

FIGS. 7A to 7F show steps of a method for manufacturing a semiconductor chip having a resin adhesive layer according to a second exemplary embodiment of the present invention.

Figure 8:
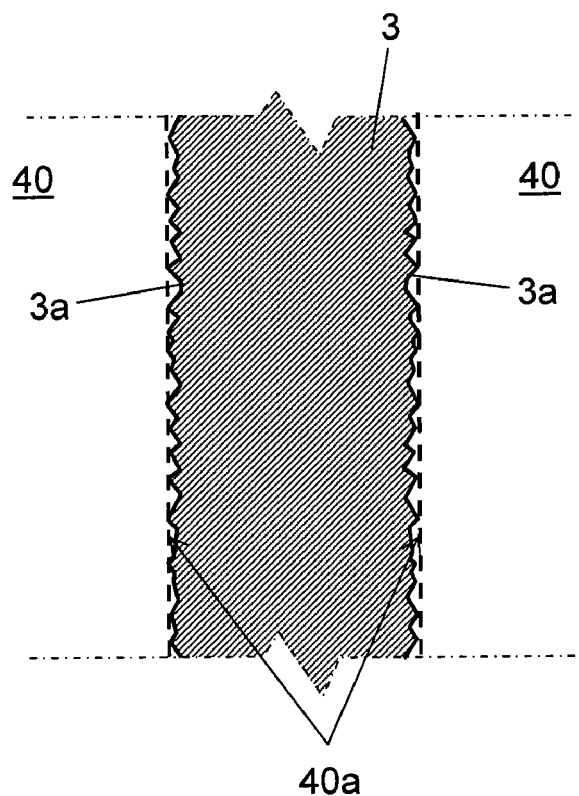
FIG. 8 is an enlarged view of a liquid-repellent pattern used in the method for manufacturing a semiconductor chip having a resin adhesive layer according to the second exemplary embodiment.
Figure 9:
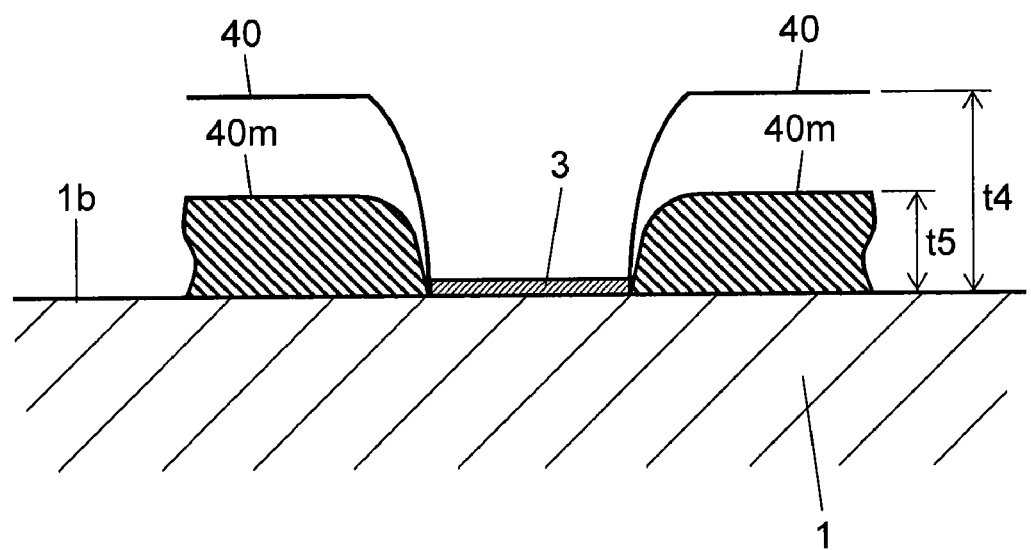
FIG. 9 is an enlarged sectional view of a semiconductor wafer to be plasma-diced in the method for manufacturing a semiconductor chip having a resin adhesive layer according to the second exemplary embodiment.

FIG. 8 is an enlarged view of a liquid-repellent pattern used in the method. FIG. 9 is an enlarged sectional view of a semiconductor wafer to be plasma diced in the method. FIGS. 10A to 10D show steps of bonding a semiconductor chip having a resin adhesive layer manufactured in the method.

The present second exemplary embodiment shows a method for manufacturing a semiconductor chip by applying the method for processing a substrate shown in the first exemplary embodiment. In the second exemplary embodiment, the resin film used as the mask for plasma etching in the first exemplary embodiment is used as a resin adhesive layer for die bonding. In FIGS. 7A to 9, like components are labeled with like reference numerals with respect to the first exemplary embodiment.

The liquid-repellent pattern to be used in the present second exemplary embodiment will be described as follows. The liquid-repellent pattern is a resin (a repellent agent) which repels a solvent in a liquid resin that will become a later-described resin adhesive layer. This pattern can be formed by printing a liquid-repellent liquid in a predetermined pattern and then volatizing the solvent in the same manner as in the first exemplary embodiment. The printing can be transfer printing, screen printing, dispensing, inkjet printing, or the like.

The resin that will become the resin adhesive layer can be an epoxy-based thermosetting resin. The resin adhesive layer is formed by applying a liquid resin containing the thermosetting resin dissolved in a solvent to the surface to be processed of the substrate on which the above-described liquid-repellent pattern has been formed. The liquid resin is applied by dispensing, inkjet printing, spin coating, or the like. The liquid resin applied to the surface to be processed is spread to the area on the surface other than the area having the liquid-repellent pattern because the solvent is repelled by the repellent agent. Then, the solvent in the liquid resin is volatized by heating the substrate, and the thermosetting resin is semi-cured, thereby forming the resin adhesive layer.

In the present invention, it is essential that the repellent agent has repellency against the solvent in the liquid resin that will become the resin adhesive layer. In addition, the solvent has to be able to be blended with the thermosetting resin. Therefore, in a case where the thermosetting resin is an epoxy-based thermosetting resin (SP value: 10.9), the solvent used is an alcohol-based solvent having an SP value of 10.0 to 11.9. In this case, the repellent agent can be an acrylic-based resin (SP value: 9.2), a silicon-based resin (SP value: 7.0), or a fluorine-based resin (SP value: 3.6).

Figure 7A:
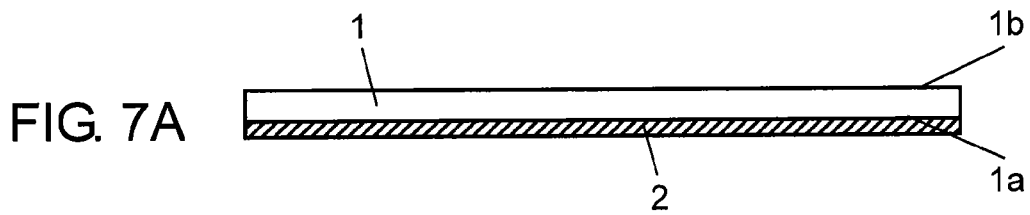
FIG. 7A shows a step of a method for manufacturing a semiconductor chip having a resin adhesive layer according to a second exemplary embodiment of the present invention.

The method for manufacturing a semiconductor chip having a resin adhesive layer will be described as follows with reference to FIGS. 7A to 7F. In FIG. 7A, semiconductor wafer 1 as a substrate includes a plurality of semiconductor chips each having integrated circuits (semiconductor apparatuses). Semiconductor wafer 1 has circuit-forming face 1a and rear surface 1b. Circuit forming face 1a has integrated circuits mounted thereon, and is covered with protective sheet 2 for protecting the integrated circuits. Rear surface 1b is thinned to not more than 100 µm by removing its surface by mechanical grinding in a previous thinning process.

Figure 7B:
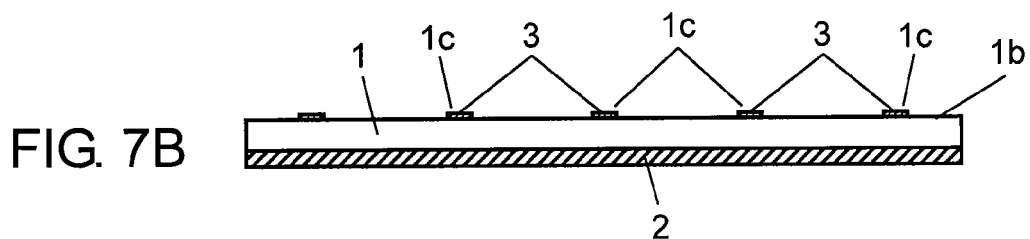
FIG. 7B shows another step of the method for manufacturing a semiconductor chip having a resin adhesive layer according to the second exemplary embodiment.

As shown in FIG. 7B, a liquid-repellent pattern is formed on rear surface 1b opposite to the circuit-forming face of semiconductor wafer 1. The pattern is formed along grid lines corresponding to scribe lines 1c (see also FIG. 2) which divide semiconductor wafer 1 into individual semiconductor chips 1e (liquid-repellent pattern formation process). The liquid-repellent pattern formation process will not be described in detail because it is the same as in the first exemplary embodiment.

Figure 7C:
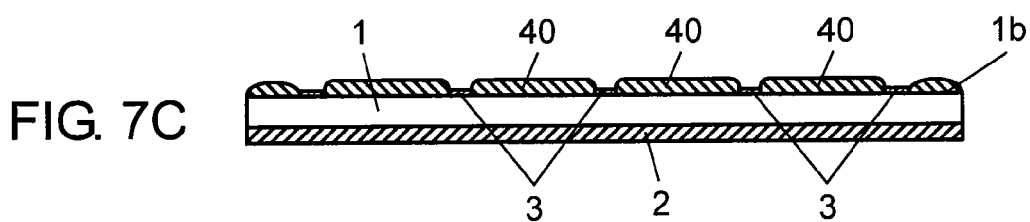
FIG. 7C shows another step of the method for manufacturing a semiconductor chip having a resin adhesive layer according to the second exemplary embodiment.
Figure 7D:
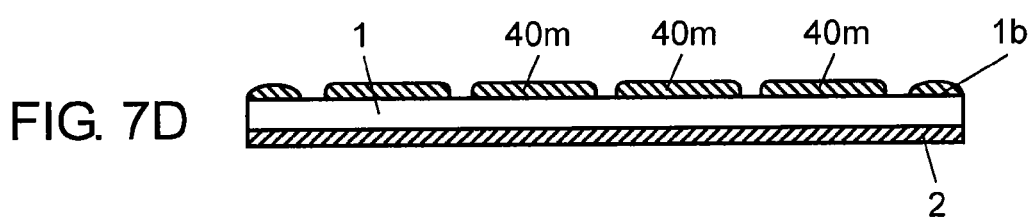
FIG. 7D shows another step of the method for manufacturing a semiconductor chip having a resin adhesive layer according to the second exemplary embodiment.

Then, as shown in FIG. 7C, the liquid resin that will become the resin adhesive layer is applied to rear surface 1b of semiconductor wafer 1 on which the pattern of liquid-repellent film 3 has been formed. As shown in FIG. 7D, the liquid resin is repelled by the surface of liquid-repellent film 3 and is left in the area not having liquid-repellent film 3. This results in the formation of resin film 40 in the area not having the liquid-repellent pattern on rear surface 1b of semiconductor wafer 1 (resin film formation process). Resin film 40 has a film thickness t2 larger than thickness t1 of the liquid-repellent pattern.

The liquid resin is an epoxy-based thermosetting resin which cannot be removed by plasma etching intended to remove the silicon composing semiconductor wafer 1 and which can function as a resin adhesive layer for die bonding after semiconductor wafer 1 is cut into semiconductor chips. Resin film 40 can be formed by dipping, spin coating, dispensing, inkjet printing, or other various methods.

FIG. 8 is an enlarged view of liquid-repellent film 3 and its vicinity on rear surface 1b after the resin film formation process. Liquid-repellent film 3 has slightly zigzagged (serrated) edges 3a at its both ends in the width direction, but resin film 40 has nearly straight and smooth contour 40a (shown by dotted lines in FIG. 8), which is in contact with edges 3a. The reason for such contour 40a is that resin film 40 is liquid having surface tension, which prevents resin film 40 from following the fine asperities of edges 3a. This is an advantageous property to form a mask having smooth edges. Resin film 40 having smooth contour 40a is then subjected to the subsequent baking process so as to form a mask whose edges are well fitted to contour 40a (smooth edges).

Then, semiconductor wafer 1 having resin film 40 is subjected to a curing process and heated to 90° C. or so. As a result, resin film 40 is semi-cured (B-stage), thereby forming resin adhesive layer 40m (resin adhesive layer formation process). In this case, resin adhesive layer 40m functions as a mask for plasma etching because it covers the area other than the area to be removed by plasma etching (the range of liquid-repellent film 3 along scribe lines 1c). Thickness of resin adhesive layer 40m is reduced by the amount corresponding to the evaporation of the solvent, compared with the original thickness immediately after application.

FIG. 9 is a sectional view of the resin film and the resin adhesive layer. In the resin adhesive layer formation process, the solvent is evaporated from resin film 40, making thickness t5 of resin adhesive layer 40m smaller than film thickness t4 of resin film 40. Therefore, thickness t5 of resin adhesive layer 40m is controlled by controlling film thickness t4 of resin film 40, that is, the amount of coating of the liquid resin. Thickness t5 of resin adhesive layer 40m is determined by the thickness of semiconductor chips 1e to be bonded, the thickness of adhesive layer after bonding, or other conditions. In the present embodiment, thickness t5 is determined by the thickness of the adhesive layer used to die-bond semiconductor chips 1e, and is preferably in the range of 20 µm to 30 µm. The relation (the rate of shrinkage) between thicknesses t4 and t5 can be determined by experiments or the like. Therefore, film thickness t4 of resin film 40 required to determine thickness t5 of resin adhesive layer 40m is determined from the rate of shrinkage and thickness t5. Once film thickness t2 is determined, the required amount of the liquid resin is determined by geometrical calculation.

After the resin adhesive layer formation process, the pattern of liquid-repellent film 3 is dissolved by the solvent so as to be removed from rear surface 1b (liquid-repellent pattern removal process). This process will not be described because it is the same as in the first exemplary embodiment.

Figure 7E:
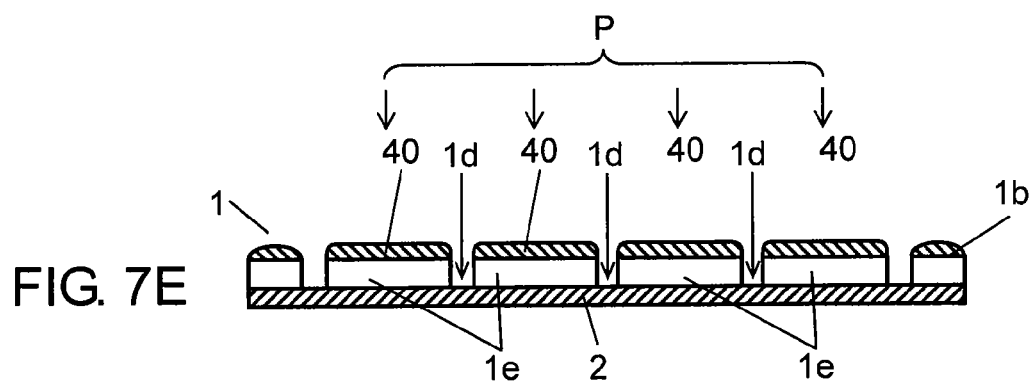
FIG. 7E shows another step of the method for manufacturing a semiconductor chip having a resin adhesive layer according to the second exemplary embodiment.

After the liquid-repellent pattern removal process, semiconductor wafer 1 is subjected to etching for dicing from the side of rear surface 1b, which is the surface to be processed of semiconductor wafer 1. The etching is performed until protective sheet 2 is exposed on the side of rear surface 1b by using resin adhesive layer 40m as a mask (etching process). More specifically, semiconductor wafer 1 is carried to a plasma treatment device, and subjected to fluorine-based plasma P (FIG. 7E) such as SF6 from the side of rear surface 1b. As a result, the area on rear surface 1b that is not covered with resin adhesive layer 40m and is exposed to plasma P is removed by the etching effect of plasma P, thereby forming etched grooves 1d. Etched grooves 1d penetrate throughout semiconductor wafer 1 so as to cut semiconductor wafer 1 into individual semiconductor chips 1e as shown in FIG. 7E.

The etching using plasma P provides the heat effect of plasma P to resin adhesive layer 40m. Since resin adhesive layer 40m needs to be in a semi-cured state (B stage) as described above, this plasma treatment is required to control the surface temperature of resin adhesive layer 40m not to exceed the thermosetting temperature (100° C. to 150° C.) of the selected epoxy-based resin. The temperature control is performed by controlling conditions for the plasma treatment in the plasma treatment device, such as adjusting the output of the high-frequency power source or circulating a coolant through the electrode portion in which semiconductor wafer 1 is placed. Thus, semiconductor wafer 1 is prevented from being heated over an optimum range.

This plasma dicing produces resin adhesive layer 40m (mask) having smooth edges, allowing individual semiconductor chips 1e to have diced edges with an even and smooth cut section. This reduces problems that are likely to occur when the cut sections are rough, such as fine cracks due to the stress concentration in a slightly uneven cut section, thereby preventing a reduction in the reliability of the semiconductor chips.

Figure 7F:
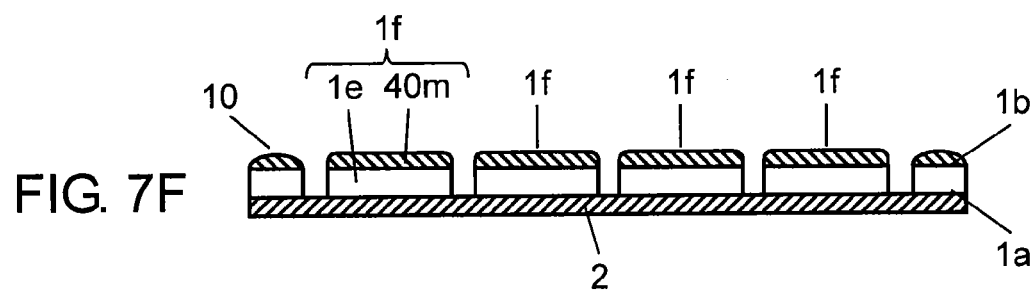
FIG. 7F shows another step of the method for manufacturing a semiconductor chip having a resin adhesive layer according to the second exemplary embodiment.

Then, as shown in FIG. 7F, after the etching process, semiconductor wafer 1 having protective sheet 2 on its circuit-forming face 1a is subjected to plasma dicing, thereby being cut into semiconductor chips 1f each having a resin adhesive layer. Semiconductor chips 1f thus cut are collectively referred to as semiconductor chip array 10. Semiconductor chips 1f are provided on rear surface 1b with resin adhesive layer 40m for die bonding, and are individually taken out of semiconductor chip array 10 when boned to the substrate.

Figure 10A:
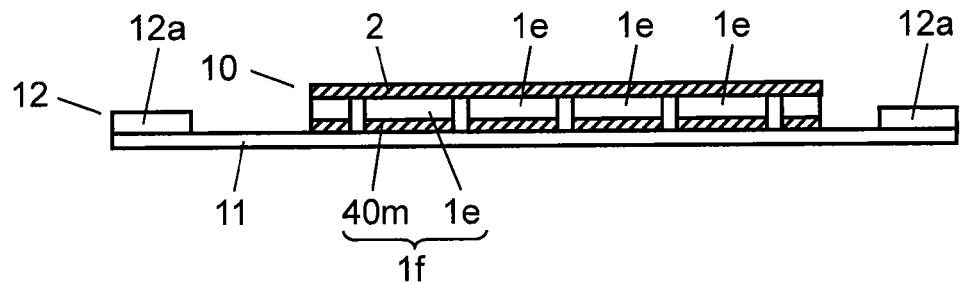
FIG. 10A shows a step of bonding a semiconductor chip having a resin adhesive layer manufactured in the method according to the second exemplary embodiment.

Semiconductor chips 1f each having a resin adhesive layer are die-bonded in the following manner as shown in FIGS. 10A to 10D. As shown in FIG. 10A, semiconductor chip array 10, which consists of semiconductor chips 1f each having a resin adhesive layer covered with protective sheet 2, is held on wafer jig 12. Wafer jig 12 includes annular wafer ring 12a, and holding sheet 11 stretched on ring 12a. More specifically, semiconductor chip array 10 is held by wafer jig 12 by fixing resin adhesive layer 40m on holding sheet 11 with protective sheet 2 up.

Figure 10B:
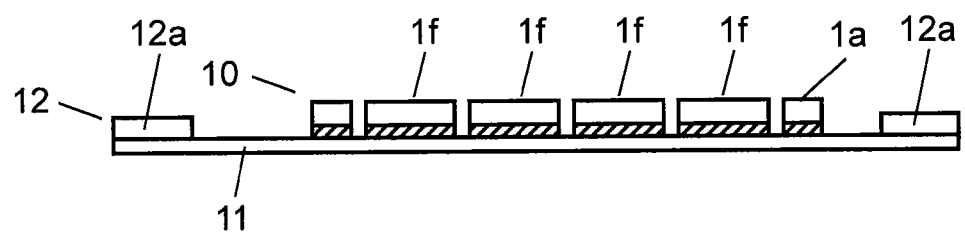
FIG. 10B shows another step of bonding a semiconductor chip having a resin adhesive layer manufactured in the method according to the second exemplary embodiment.
Figure 10C:
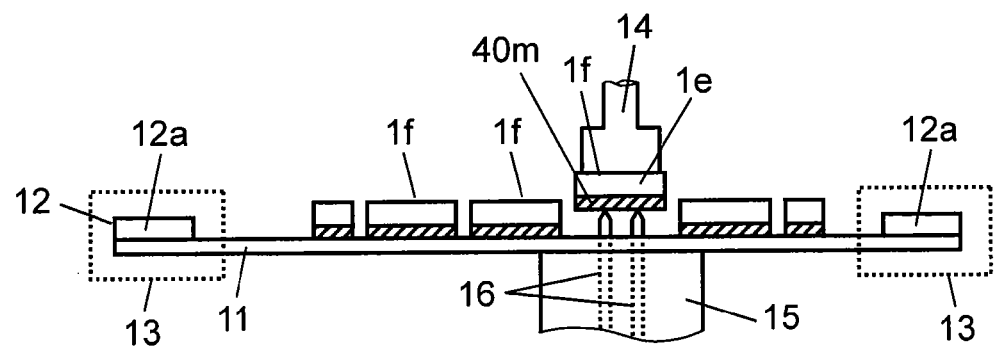
FIG. 10C shows another step of bonding a semiconductor chip having a resin adhesive layer manufactured in the method according to the second exemplary embodiment.

Then, as shown in FIG. 10B, protective sheet 2 is peeled off of semiconductor chip array 10. As a result, semiconductor chips 1f are exposed, with circuit-forming face 1a of semiconductor chips 1e up. Semiconductor chip array 10 is carried to a die bonding device in which wafer ring 12a is held by wafer retention mechanism 13 as shown in FIG. 10C. As a result, semiconductor chips 1f each having a resin adhesive layer can be individually taken out.

Semiconductor chips 1f are taken out as follows. First, bonding tool 14 and ejector device 15 are positioned to a selected semiconductor chip 1f having a resin adhesive layer. Then, the selected semiconductor chip 1f is pushed up by ejector pin 16 of ejector device 15, and is vacuum held by bonding tool 14. Bonding tool 14 includes a heating means for heating semiconductor chips 1f each having a resin adhesive layer to a predetermined temperature.

Figure 10D:
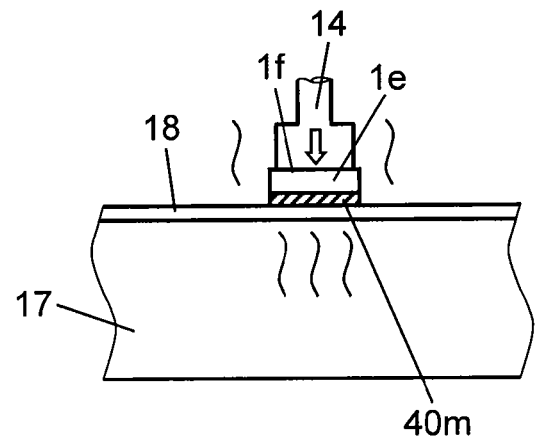
FIG. 10D shows another step of bonding a semiconductor chip having a resin adhesive layer manufactured in the method according to the second exemplary embodiment.

Then, bonding tool 14, which is vacuum holding the semiconductor chip 1f, moves over heating base 17 mounted with substrate 18 to which semiconductor chips 1f are to be bonded. Substrate 18 is heated to a predetermined temperature by a heating mechanism (not shown) included in heating base 17. Then, as shown in FIG. 10D, the selected semiconductor chip 1f is positioned where it is to be bonded, and bonding tool 14 is lowered to put resin adhesive layer 40m on the top surface of substrate 18. Next, bonding tool 14 is pressed against the semiconductor chip 1f with a predetermined pressure so as to press resin adhesive layer 40m into substrate 18. The pressing is continued for a predetermined time to promote the thermosetting reaction of semi-cured resin adhesive layer 40m. As a result, semiconductor chip 1e is bonded to substrate 18 via thermoset resin adhesive layer 40m.

As described above, according to the present second exemplary embodiment, a semiconductor chip including semiconductor apparatuses is manufactured by cutting semiconductor wafer 1 into semiconductor chips 1f each having a resin adhesive layer by plasma etching in the following manner. First, a liquid-repellent pattern is formed by printing a liquid-repellent liquid on scribe lines 1c, which are the boundaries between semiconductor chips 1e on rear surface 1b opposite to circuit-forming face 1a of semiconductor wafer 1. Then, resin film 40 thicker than the liquid-repellent pattern is formed in the area not having the liquid-repellent pattern by supplying a liquid resin to rear surface 1b on which the liquid-repellent pattern has been formed. Next, resin adhesive layer 40m is formed by semi-curing resin film 40, and the liquid-repellent pattern is removed from the rear surface. Then, semiconductor wafer 1 is etched from the side of rear surface 1b, using resin adhesive layer 40m as a mask. As a result, the mask for plasma etching can be formed at low cost, and can also be used as resin adhesive layer 40m for die bonding.

The first and second exemplary embodiments show examples of cutting a semiconductor wafer as a substrate into individual semiconductor chips by plasma dicing. The present invention, however, is not limited to these examples, and can be applied to the processing of a substrate requiring the formation of a mask for plasma etching. Examples of processing a substrate using plasma etching are as follows: a process for forming through-holes in a semiconductor substrate, a process for forming a micromechanical device by applying semiconductor processing technologies to the fabrication of MEMS (micro electro mechanical systems) devices, and a process for forming circuit patterns on a display transparent panel.

INDUSTRIAL APPLICABILITY

The method for processing a substrate and the method for manufacturing a semiconductor chip according to the present invention allow the formation of a mask for plasma etching at low cost, and are therefore applicable to processes for processing a substrate, such as cutting a semiconductor wafer as a substrate into individual semiconductor chips by plasma dicing.

The invention claimed is:
1. A method for processing a substrate so as to partially remove the substrate by plasma etching, the method comprising:
   forming a liquid-repellent pattern by printing a liquid-repellent liquid on an area of a surface to be processed of the substrate, the area being to be removed by the etching;

forming a resin film thicker than the liquid-repellent pattern by supplying a liquid resin to the surface to be processed on which the liquid-repellent pattern has been formed, the resin film being formed in an area not having the liquid-repellent pattern;

forming a mask by curing the resin film, the mask being formed on the surface to be processed and covering the area other than the area to be removed by the etching;

removing the liquid-repellent pattern from the surface to be processed after the mask is formed;

plasma etching the substrate from a side of the surface to be processed after the liquid-repellent pattern is removed; and removing the mask from the surface to be processed after the etching.

2. A method for manufacturing a semiconductor chip by cutting a semiconductor wafer into semiconductor chips by plasma etching, the semiconductor wafer having semiconductor apparatuses on a circuit-forming face thereof covered with a protective sheet, and the semiconductor chips each including individual semiconductor apparatuses, the method comprising:

forming a liquid-repellent pattern by printing a liquid-repellent liquid on scribe lines on a surface to be processed opposite to the circuit-forming face of the semiconductor wafer, the scribe lines being boundaries between the semiconductor chips;

forming a resin film thicker than the liquid-repellent pattern by supplying a liquid resin to the surface to be processed on which the liquid-repellent pattern has been formed, the resin film being formed in an area not having the liquid-repellent pattern;

forming a mask by curing the resin film, the mask being formed on the surface to be processed and covering the area other than the area to be removed by the etching;

removing the liquid-repellent pattern from the surface to be processed after the mask is formed;

plasma etching the semiconductor wafer from a side of the surface to be processed until the protective sheet is exposed on the side of the surface to be processed after the liquid-repellent pattern is removed; and removing the mask from the surface to be processed after the etching.

3. A method for manufacturing a semiconductor chip having a resin adhesive layer by dicing a semiconductor wafer into semiconductor apparatuses by plasma etching, the semiconductor wafer having a plurality of semiconductor apparatuses on a circuit-forming face thereof covered with a protective sheet, and the semiconductor chips each having the resin adhesive layer on a rear surface thereof for die bonding, the method comprising:

forming a liquid-repellent pattern by printing a liquid-repellent liquid on scribe lines on a rear surface opposite to the circuit-forming face of the semiconductor wafer, the scribe lines being boundaries between the semiconductor chips;

forming a resin film thicker than the liquid-repellent pattern by supplying a liquid resin to the rear surface on which the liquid-repellent pattern has been formed, the resin film being formed in an area not having the liquid-repellent pattern;

forming the resin adhesive layer by semi-curing the resin film;

removing the liquid-repellent pattern from the rear surface after the resin adhesive layer is formed; and plasma etching the semiconductor wafer from a side of the rear surface until the protective sheet is exposed on the side of the rear surface, using the resin adhesive layer as a mask after the liquid-repellent pattern is removed, the plasma etching conducted at a temperature not exceeding a thermosetting temperature of the resin adhesive layer.

* * * * *